US006868047B2

(12) United States Patent
Sartschev et al.

(10) Patent No.: US 6,868,047 B2
(45) Date of Patent: Mar. 15, 2005

(54) COMPACT ATE WITH TIME STAMP SYSTEM

(75) Inventors: Ronald A. Sartschev, Dunstable, MA (US); Jun Xu, Nashua, NH (US)

(73) Assignee: Teradyne, Inc., Boston, MA (US)

( * ) Notice: Subject to any disclaimer, the term of this patent is extended or adjusted under 35 U.S.C. 154(b) by 321 days.

(21) Appl. No.: 10/015,865

(22) Filed: Dec. 12, 2001

(65) Prior Publication Data

US 2003/0107951 A1 Jun. 12, 2003

(51) Int. Cl.$^7$ .............................................. G04F 10/00
(52) U.S. Cl. ........................ 368/118; 368/113; 368/120
(58) Field of Search ................................ 368/113, 118, 368/120

(56) References Cited

U.S. PATENT DOCUMENTS

| | | | | | |
|---|---|---|---|---|---|
| 4,104,590 | A | * | 8/1978 | Zhevnerov | 324/166 |
| 4,164,648 | A | * | 8/1979 | Chu | 377/20 |
| 4,402,081 | A | * | 8/1983 | Ichimiya et al. | 714/718 |
| 5,479,415 | A | * | 12/1995 | Staiger | 714/743 |
| 5,694,377 | A | | 12/1997 | Kushnick | 368/120 |
| 5,872,745 | A | * | 2/1999 | Murakami | 368/113 |
| 6,073,259 | A | * | 6/2000 | Sartschev et al. | 714/724 |
| 6,246,737 | B1 | | 6/2001 | Kuglin | 375/371 |
| 6,285,963 | B1 | | 9/2001 | West | 702/117 |

OTHER PUBLICATIONS

Mota, M. et al.: "A flexible multi-channel high-resolution time-to-digital converter ASIC", 2000 IEEE Nuclear Science Symposium. Conference Record (Cat. No. OOCH37149), 2000 IEEE Nuclear Science Symposium. Conference Record, Lyon, France, Oct. 15–20, 2000, vol.2, pp. 9/155–9 189, XP002236607 2000, Piscataway, NJ, USA, IEEE, USA ISBN: 0-7803-6503-8, p. 9–155, p. 9–158.

Mota, M. et al: "A four-channel self-calibrating high-resolution time to digital converter" Electronics, Circuits and Systems, 1998, IEEE International Conference on Lisboa, Portugal Sep. 7–10, 1998, Piscataway, NJ, USA, IEEE, US, Sep. 7, 1998, pp. 409–412, XP010366204, ISBN: 0-7803-5008-1, p. 409, p. 410.

Christiansen J.: "An integrated high resolution CMOS timing generator based on an array of delay locked loops", IEEE Jounal of Solid0State Circuits, IEEE Inc. New York, US, vol. 31, No. 7, Jul. 1, 1996, pp. 952–957, XP000632381, ISSN: 0018–9200, the whole document.

Rainer Geiges, et al., "A High Resolution TDC Subsystem," IEEE Transactions on Nuclear Science, vol. 41, No. 1, Feb. 1, 1994.

M. Sugawara, et al. "A 2.5V 100MS/s 8bit ADC Using Pre-Linearization Input Buffer and Level Up DAC/Subtractor," 1998 Symposium on VLSI Circuits Digest of Technical Papers, Aug. 1998.

(List continued on next page.)

Primary Examiner—Randy W. Gibson
Assistant Examiner—Thanh S. Phan
(74) Attorney, Agent, or Firm—Teradyne Legal Department

(57) ABSTRACT

A accurate time measurement circuit. The design is amenable to implementation as a CMOS integrated circuits, making the circuit suitable for a highly integrated system, such as automatic test equipment where multiple time measurement circuits are required. The circuit uses a delay locked loop to generate a plurality of signals that are delayed in time by an interval D. The signal to be measured is fed to a bank of delay elements, each with a slightly different delay with the difference in delay between the first and the last being more than D. An accurate time measurement is achieved by finding coincidence between one of the TAP signals and one of the delay signals. The circuit has much greater accuracy than a traditional delay line based time measurement circuit with the same number of taps. It therefore provides both accuracy and fast re-fire time and is less susceptible to noise.

20 Claims, 5 Drawing Sheets

OTHER PUBLICATIONS

J. Christiansen, "An Integrated CMOS 0.15 ns Digital Timing Generator for TDS's and Clock Distribution Systems," Mar. 1995.

Piotr Dudek, et al., "A High-Resolution CMOS Time-to-Digital Converter Utilizing a Vernier Delay Line," IEEE Transactions on Solid-State Circuits, vol. 35, No. 2, Feb. 2000.

Yasuo Arai, et al., "A CMOS Four-Channel X 1K Time Memory LSI with 1-ns/b Resolution," IEEE Journal of Solid-State Circuits, vol. 27, No. 3, Mar. 1992.

Andrew E. Stevens, et al., "A Time-to-Voltage Converter and Analog Memory for Colliding Beam Detectors," IEEE Journal of Solid-State Circuits, vol. 24, No. 6, Dec. 1989.

C. Thomas Gray, et al., "A Sampling Technique and Its CMOS Implementation with 1 Gb/s Bandwidth and 25 ps Resolution," IEEE Journal of Solid-State Circuits, vol. 29, No. 3, Mar. 1994.

Keunoh Park, et al., "20ps Resolution Time-to-Digital Converter for Digital Storage Oscilloscopes," Sep. 1999.

Joonbae Park, et al., "An Auto-Ranging 50-210Mb/s Clock Recovery Circuit with a Time-to-Digital Converter," 1999 IEEE International Solid-State Circuits Conference, Feb. 17, 1999.

Elvi Raisanen-Ruotsalainen, et al., "An Integrated Time-to-Ditigal Converter with 30-ps Single-Shot Precision," IEEE Journal of Solid-State Circuits, vol. 35, No. 10, Oct. 2000.

R. Rankinen, et al., "Time-to-Digital Conversion with 10 ps Single Shot Resolution," 1991.

Elvi Raisanen-Ruotsalainen, et al., "A BiCMOS Time-to-Digital Converter with 30 ps Resolution," 1999.

Elvi Raisanen-Ruotsalainen, et al., "A Low-Power CMOS Time-to-Digital Converter," IEEE Journal of Solid-State Circuits, vol. 30, No. 9, Sep. 1995.

Hideki Shirasu, et al., "A VME 32 Channel Pipeline TDC Module with TMC LSIs," IEEE Transactions on Nuclear Science, vol. 43, No. 3, Jun. 1996.

J. Kalisz, et al, "Time-to-Digital Converter with Direct Coding and 100ps Resolution," Electronics Letters, vol. 31, No. 19, Sep. 14, 1995.

Dinis M. Santos, et al., "A CMOS Delay Locked Loop and Sub-Nanosecond Time-to-Digital Converter Chip," 1996.

Antti Mantyniemi, et al., "A High Resolution Digital CMOS Time-to-Digital Converter Based On Nested Delay Locked Loops," 1999.

Timo E. Rahkonen, et al., "The Use of Stabilized CMOS Delay Lines for the Digitization of Short Time Intervals," IEEE Journal of Solid-State Circuits, vol. 28, No. 8, Aug. 1993.

Timo Rahknone, et al., "Time Interval Measurements Using Integrated Tapped CMOS Delay Lines," 1990.

P. Bailly, et al., "A 16-Channel Digital TDC Chip,".

Vadim Gutnik, et al., "On-Chip Picosecond Time Measurement," 2000 Symposium on VSLI Circuits Digest of Technical Papers, Apr. 2000.

Jozef Kalisz, et al., "Single-Chip Interpolating Time Counter With 200-ps Resolution and 43-s Range," IEEE Transactions on Instrumentation and Measurement, vol. 46, No. 4, Aug. 1997.

C. Ljuslin, et al., "An Integrated 16-Channel CMOS Time to Digital Converter," IEEE Transactions on Nuclear Science, vol. 41, No. 4, Aug. 1994.

Beomsup Kim, et al., "A 30-MHz Hybrid Analog/Digital Clock Recovery Circuit in 2-um CMOS," IEEE Journal of Solid-State Circuits, vol. 25, No. 6, Dec. 1990.

"Misfire Analysis with Time Interval Analyzer," Yokogawa Test and Measurement, wysiwyg://210/http://www.yokogawa.com/tm/appli/48/48misfire.html.

"Using FastFrame Segmented Memory," Tektronix MBD: Applications, sysiyg://BODY.181/http://www.tektronix . . . easurement/App_Notes/dpo/fastframe/eng/.

\* cited by examiner

COMPACT ATE WITH TIME STAMP SYSTEM

This invention relates generally to automatic test equipment and more specifically to time measurement within automatic test equipment.

Semiconductor chips are generally tested at multiple stages during their manufacture with automatic test equipment (ATE). To determine whether a chip is properly functioning, it is important to know the values of signals generated by the chip in response to various stimulus signals. In addition to the value, it is often important to know whether those signals occur at the expected time. Thus, ATE has traditionally included timing generation circuitry that controls when a stimulus is applied and when a measurement is made.

Traditional digital logic chips contain circuitry that is synchronized by a master clock signal. In testing digital logic chips, time is often relative to the cycles of a master clock signal. Thus, the timing generator creates signals, sometimes called "edge signals," that have specified times relative to a cycle of a master clock signal. In most ATE systems, the time of each edge signal can be programmed so that the ATE can be used to test different kinds of chips or run different kinds of tests.

However, simply generating or measuring signals relative to a cycle of a master clock is sometimes not adequate to test a chip. More recently, chips have included analog and digital circuitry. The analog circuitry processes signals, such as audio or video signals. These signals have features that are often not synchronized to the master clock of the chip. Thus, to measure the timing of these signals, it is not adequate for ATE to generate edges relative to a master clock. Rather, some ATE includes a time stamp system.

A time stamp system generates a time tag that indicates when a particular signal occurs relative to some reference time. A very simple time stamp system is a counter. A reference signal starts the counter running. The event signal stops the counter. After the counter stops, its value can be read out and indicates the amount of time between the start and stop events.

The drawback of a simple counter is that it has limited resolution. Each count of the counter reflects the passage of time that is one period of whatever clock signal is running the counter. For example, if the counter is clocked by an 800 MHz signal, each count represents 1.25 nanoseconds. Regardless of the actual time being measured, a time measurement system that uses such a counter will report time based on the number of 1.25 nanosecond increments that have passed. The counter reveals that the event occurred in a time window 1.25 nanosecond long that is after a certain number of counts and before the next count. However, there is no way to distinguish between signals that happen early in that window or late in the window, so the resolution of the measurement is limited by the period of the clock.

Often, time measurement with a resolution limited by the period of the clock will not be adequate. Very often, resolution to within a fraction of a nanosecond is required for time measurements. Therefore, many time measurement systems include an "interpolator." The interpolator measures time in the window between periods of the clock. One form of interpolator uses a ramp generator and an analog to digital converter. The clock signal triggers the ramp generator to start generating a signal. The ramp signal increases in value as time passes. The event signal stops the increase in the ramp signal and causes the A/D converter to measure the value of the ramp. The output of the A/D is proportional to the passage of time after the last clock pulse and indicates an additional time that should be added to the time measured by the counter.

A drawback of this approach is that the interpolator must be made with very stable circuitry. Variations in the delays introduced by the interpolator limit the accuracy of the measurements. For example, variations in delay can be caused by changes in operating temperature or other environmental factors. Thus, interpolators have traditionally been made of ECL components or other circuitry that has very little variation in delay. However, ECL components are expensive and not widely available.

Also, as a particular problem for ATE, we have recognized that use of ECL components for time measurement reduces the level of integration of the overall test system. Much of a test system is built with CMOS circuitry. CMOS circuitry is small, allowing for high levels of integration on a chip. ECL circuits are built using different processes than CMOS and will likely be on a separate chip. The extra chip, as well as the added space consumed by including I/O pads in the CMOS chips to connect to the ECL chip increases cost and reduces the level of integration of the overall test system. These problems are magnified in ATE because ATE generally consists of hundreds and sometimes thousands of channels in which separate signals are generated. Therefore, numerous copies of the chips will be required in each ATE system.

Further, ECL components consume relatively large amounts of power in comparison to CMOS. High power consumption is a drawback for circuitry in ATE. In ATE, it is desirable to get the circuits that must make accurate measurements physically as close to the chip under test as possible. Time measurement is one such circuit. However, if these circuits consume large amounts of power, they also generate large amounts of heat. Packing such chips close together results in a high heat density, which in turn creates a need for complicated cooling systems. Thus, using chips with higher power utilization has side effects that further increase the cost, size and complexity of ATE.

An alternate approach to a timestamp is to have two delay lines, one of which delays the clock and the other delaying the edge being measured. The delay elements on the clock path have delay T1 and the delay elements on the edge input have delay T2. At each delay stage, the clock path outputs are tied to the clock input of a latch and the edge path outputs are tied to the D input of the latch. Then each stage in the delay path can be used to measure a time difference of T2-T1 compared to the previous stage. Such a circuit is easily implemented in CMOS as is described in C. Tommas Gray, Willhelmus A. M. Van Nojije and R. K. Cavin "A sampling Technique and Its CMOS Implementation with 1 Gb/s Bandwidth and 25 ps Resolution", IEEE J. Solid-state Circuits, vol.29. No.3. pp.340–349, Mar. 1994. However, the delay through the full delay line is T1*Tclk/(T2-T1), or for example 16 times the clock period Tclk if T2-T1 is 1/16 of T1. This means the refire time (time before the timestamp can be reused) is long, at least 16 clock cycles, and the signal accumulates errors due to jitter and power supply noise during this entire time period.

Currently, most publication on time measurement focus on measuring time using delay lines. The delay line has a series of taps, each outputting a version of the input by a slightly longer delay. There are two common ways in which the delay lines can be configured to measure time. In what is sometimes called the "delay line" method, the clock serves as the input to the delay line. The output of each of the taps is compared to the signal being timed. The tap that coincides with the signal indicates the amount of time after the clock pulse that the signal occurred In the vernier method, two delay lines with different buffer delays are used.

Both of these methods can be implemented with a standard CMOS process. In the delay line method, a higher resolution is obtained by utilizing more buffers so that the delay of each buffer is smaller. In the vernier method, the minimum time that can be measured is set up by buffer delay difference in the two DLL lines. However, greater resolution is achieved with longer delay lines, too. A delay locked loop is used to stabilize the value of buffer delay against process variation and ambient condition. However, long delay lines have the undesired effect of creating a long re-fire time. And, long delay lines also make the noise jitter worse along the line. The measurement accuracy must be downgraded because of the jitter. For example, in a 400 Mhz clock system we need two N=256 delay stages line to achieve 10 ps timing resolution. A further drawback of making a high resolution time measurement circuit is that the long delay line draws a lot of current, which can make it unsuitable for use in a highly integrated system, such as a test system. For example, an article entitled "A High-resolution CMOS Time-to-digital Converter Utilizing a Vernier Delay Line," IEEE JSSC, vol.25, no.2, Feb. 2000, describes a 35 ps time resolution time measurement system using two 128-delay stage lines.

We have recognized that achieving a compact, low cost test system would need an accurate time stamp system that is low cost, compact and low power. As will be described below, we have achieved these goals using a CMOS time stamp system.

CMOS time measurement circuitry is known. Some ATE uses CMOS to implement timing generators. U.S. Pat. No. 6,073,259, which is hereby incorporated by reference, describes ATE using CMOS circuitry for timing generation in an ATE system. However, that patent does not describe a time stamp incorporated into ATE.

SUMMARY OF THE INVENTION

With the foregoing background in mind, it is an object to provide a low cost, compact time stamp system.

It is also an object of the invention to provide an ATE system with a time stamp system.

The foregoing and other objects are achieved with a time stamp system

BRIEF DESCRIPTION OF THE DRAWINGS

The invention will be better understood by reference to the following more detailed description and accompanying drawings in which.

DESCRIPTION OF THE PREFERRED EMBODIMENT

Figure 1:
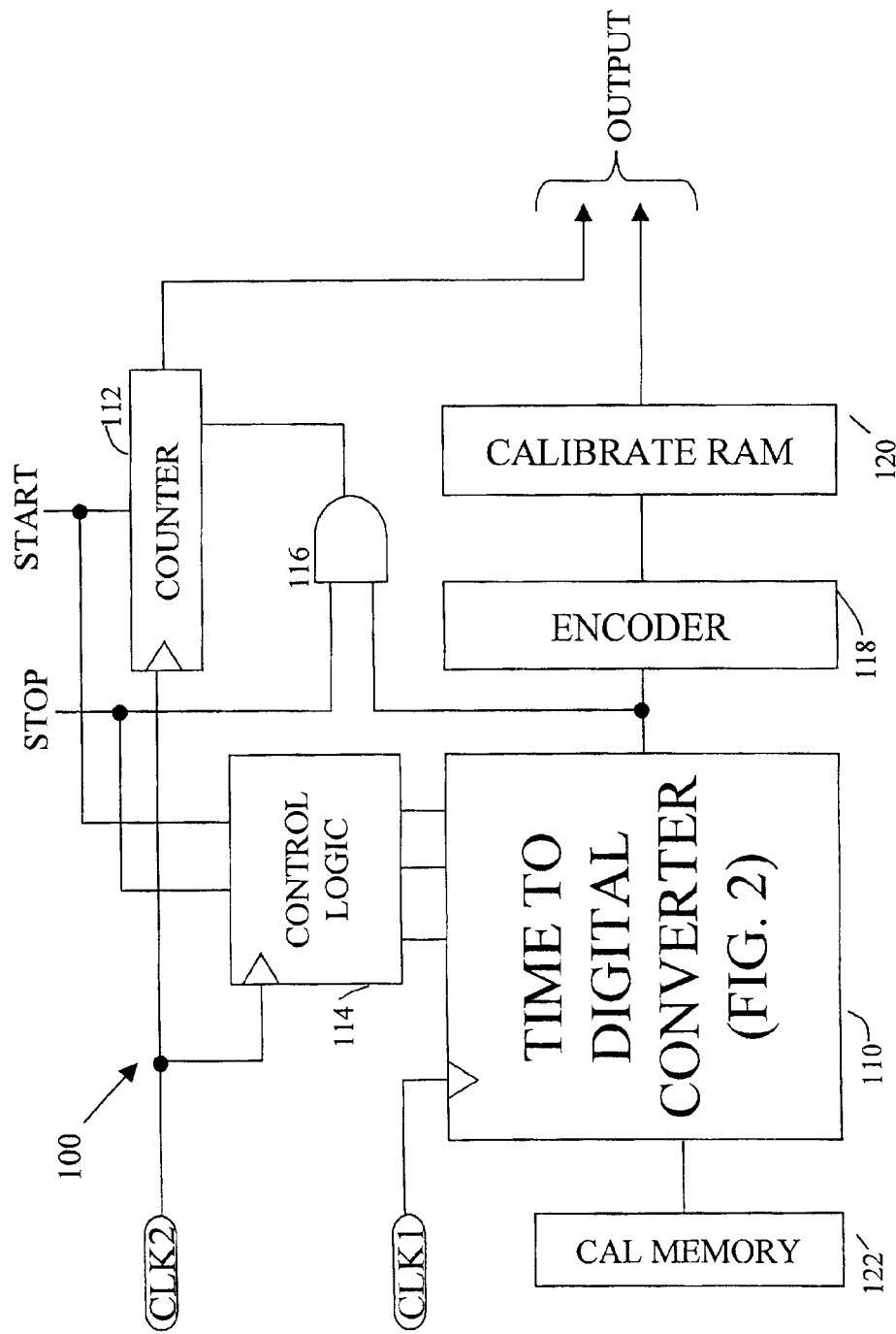
FIG. 1 is a block diagram illustrating a time stamp system incorporating the invention.

FIG. 1 shows a time stamp system incorporating the invention. A START and STOP signal are applied to the system and the system produces a digital OUTPUT that reflects the elapsed time between the START and STOP signals. In the illustrated embodiment, the START signal is synchronized to the CLK2 signal, which is a digital clock.

Upon activation of the START signal, counter 112 begins to count pulses of CLK2. By way of illustration, CLK2 could be a 400 MHz clock, such that each pulse represents the passage of 2.5 nsec. The most significant bits of the OUTPUT signal are derived from the output of counter 112. For a 400 MHz clock, the upper bits represent a time that is the value in the counter multiplied by 2.5 nsec.

The lower order bits of the OUTPUT signal represent some fraction of the period of CLK1, also a digital clock signal. The lower order bits are generated by Time to Digital Converter 110, encoder 118 and RAM 120, as will be described in greater detail below. In this way, the time stamp circuit of FIG. 1 can generate a time stamp with greater resolution than the CLK2.

The STOP and START signals act as inputs to control logic 114. In a preferred embodiment, time stamp circuit 100 is implemented as a CMOS integrated circuit chip. In the most preferred embodiments, the CMOS integrated circuit will be on a chip containing other circuitry for use in an automatic test system. Such a chip is, for example, described in U.S. Pat. No. 6,073,259, which is hereby incorporated by reference.

Control logic 114 also provides an ARM signal. The ARM signal prevents the time to digital converter from responding to any changes in the STOP signal until after a START signal is received. The ARM signal stays asserted until the time measurement is completed and is then de-asserted until the next measurement.

Control logic 114 also provides a STOP signal to time to digital converter 110. This signal causes the time to digital converter 110 to stop measuring time and output a time value. The STOP signal provided by control logic 114 is correlated to the STOP input to time stamp circuit 100.

Control logic 114 also provides a reset or clear signal. As will be described in greater detail below, time to digital converter 110 employs one-shot circuits. These circuits latch values when an input changes and generally hold the value until cleared. As will be appreciated by one of skill in the art, circuits such as one-shots, latches and flip-flops need to be cleared or reset before the circuit starts a new operation. Control logic 114 issues an appropriate reset signal after a measurement is completed and the output value is read.

The signals provided by control logic 114 are, in accordance with known design practices, formatted or level shifted by control logic 114, as appropriate for the specific circuit implementations used. The signals are also correlated with the clock signals as appropriate. In addition, control logic 114 can provide control signals to counter 112 to clear or enable it. Control signals might be applied to other circuit elements to cause them to accept inputs or provide outputs at the appropriate times. However, such control operations are well known in the art and are not expressly shown.

The output of time to digital converter 110 is provided to encoder 118. As will be described in connection with FIG. 2, the output of time to digital converter consists of a series of codes. These codes must be translated to a time value. Encoder 118 translates the codes into a time measurement.

The time measurement values are then passed to calibration RAM 120. The time measurement produced by encoder 118 reflects a nominal time measurement. It reflects the measured value if every element within the circuit has time delay characteristics that match the nominal design specifications. It is know in the art that integrated circuit chips, particularly CMOS integrated circuit chips, exhibit actual delay characteristics that deviate from the nominal values, sometimes by a significant amount. To make more accurate measurements, calibration RAM 120 stores a table that correlates the values generated by time to digital converter 110 to actual time measurements.

Use of calibration RAMs is known in other applications. The values in the calibration RAM 120 are derived from actual measurements and are periodically updated. When the time stamp circuit 100 is used in automatic test equipment, likely new values fpr the calibration RAM will be measured and loaded each time the test system is turned on. To determine the values, the pulses occurring at known times relative to a START signal are applied to the STOP time stamp circuit 100. The OUTPUT is recorded with calibration RAM 120 bypassed. That value of the OUTPUT is used as an address to calibration RAM 120. At that address, the correct time is stored. In actual operation, the output of encoder 118 is again used as the address to calibration RAM 120. The calibrated value stored at this address is read out and applied as the OUTPUT.

A second calibration feature is also included in time stamp circuit 100. As will be described in greater detail below, time to digital converter 110 includes delay elements ($230_1$ to $230_M$ FIG. 2) that provide a fixed amount of delay. Each delay circuit has a nominal delay. Because calibration RAM 120 will adjust for minor deviations in the operation time to digital converter 110, it is not necessary that each delay element match its nominal delay exactly. However, it is desirable for each delay element to have a delay that is close to the nominal delay.

As is known in the art, the switching delay of a transistor circuit, particularly a CMOS circuit, is influenced by the current flow through the transistor. Calibration memory 122 stores values that are used to adjust current sources that provide current to the transistors in the delay circuits. By measuring the actual delay of each circuit, the current can be adjusted until the actual delay closely approximates the nominal delay of the delay circuit. Calibration memory 122 is loaded with values determined during a calibration sequence. An example of a delay circuit using current control is shown in U.S. Pat. No. 6,073,259, entitled "Low Cost CMOS Tester With High Channel Density," which is hereby incorporated by reference.

The specific calibration mechanism is not crucial to the invention and is not further described. Further, many other elements that are conventional in an integrated circuit chip are not expressly described. For example, power and ground connections are not expressly shown, but one of skill in the art will appreciate that such elements are included.

Figure 2:
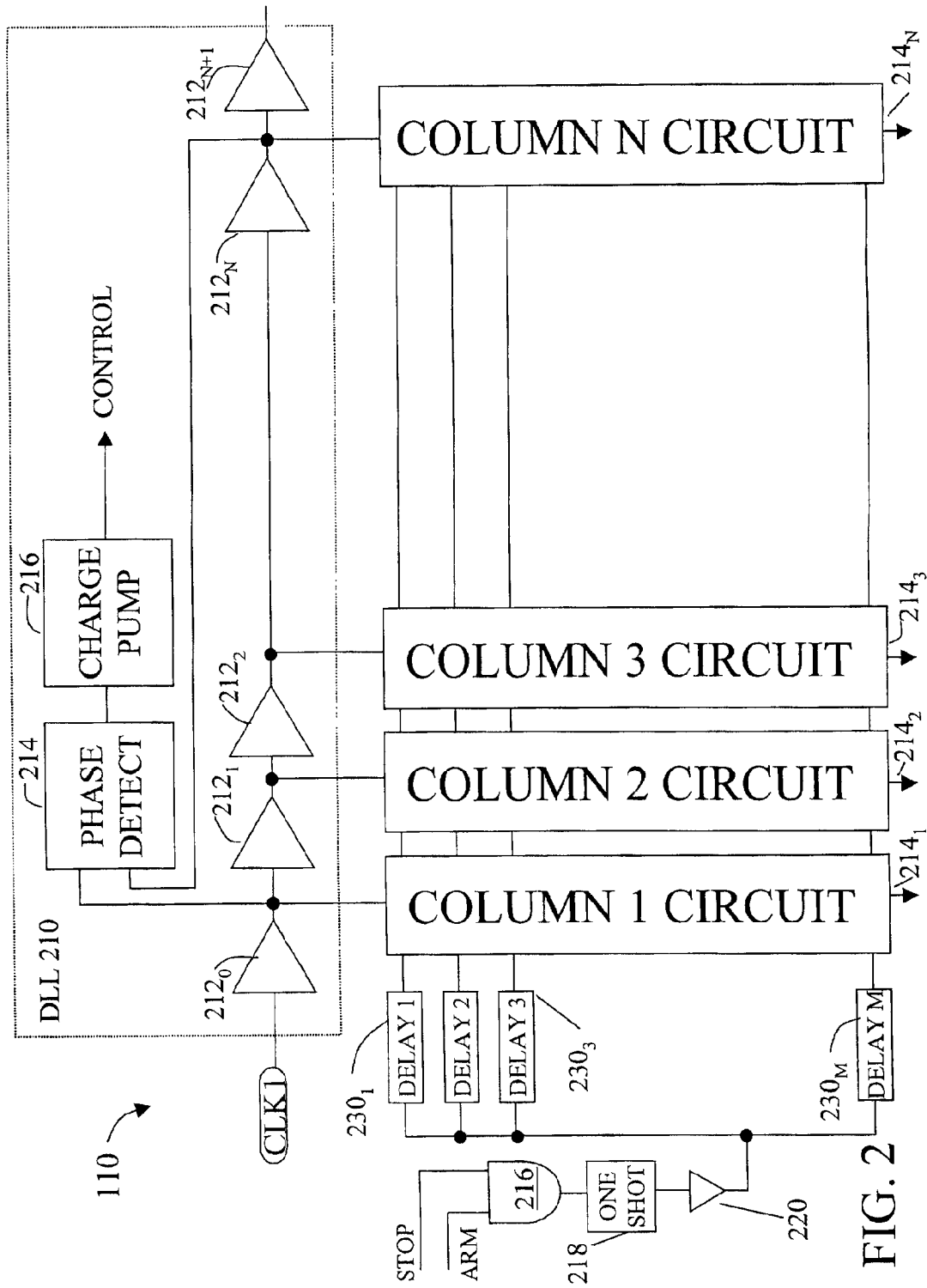
FIG. 2 shows in greater detail the time to digital converter circuit of FIG. 1.

Turning now to FIG. 2, time to digital converter 110 is shown in greater detail. Time to digital converter 110 includes a delay locked loop 210. A delay locked loop consists of a chain of delay stages $212_0$ to $212_{N+1}$. Clock signal CLK1 is applied as an input to the chain.

CLK1 is a differential clock signal that is synchronized to CLK2. Accordingly, each of the delay stages is a differential delay stage. We have found that differential delay stages are more accurate than single ended stages. However, differential stages are not critical to the invention.

The output of the first and $N^{th}$ delay stages $212_1$ and $212_N$ are applied to a phase detector 214. Phase detector 214 produces an output signal that has a polarity that depends on which signal arrives first. The output of phase detector 214 is applied to charge pump 216.

The output of charge pump 216 increases or decreases in accordance with the polarity of its input. The output of charge pump 216 is a CONTROL signal that adjusts the delay in each delay stage $212_0$ to $212_{N+1}$. Known techniques may be used for this adjustment. The delay locked loop comes to steady state when the delay through stages $212_1$ to $212_N$ equals one period of CLK1. Thus, the delay of each tap will be a fraction of the period of CLK1—that fraction being 1/N. Preferably, N will be a multiple of 2 and in a preferred embodiment is 16. The CONTROL signal may also be used to regulate delay in other circuits within the same chip that contains delay locked loop 210.

The output of each of the delay stages $212_1$ to $212_N$ is sometimes referred to as a "tap." Each tap feeds a column circuit $214_1 \ldots 214_N$. Each column circuit is described in greater detail in connection with FIG. 3.

The control inputs to time to digital converter 110 coming from control logic 114 are indicated as a STOP and an ARM signal. These signals are fed to AND gate 216. AND gate 216 ensures that the circuit does not respond to a STOP signal unless the ARM signal is asserted.

The output of AND gate 216 is fed to one shot 218. The output pulse width from one-shot circuitry is preferably less than half of clock period to provide for effective timing information of the output data. One shot 218 latches the output of AND 216. After one-shot 218 is triggered, it stays asserted until time to digital converter 110 is cleared. Clear or rest signals are not expressly shown, but one of skill in the art will understand that they are to be used.

The output of one sot 218 is fed to a buffer amplifier 220. Buffer amplifier 220 fans out the signal to a plurality of rows. Buffer amplifiers are often used in circuits where one output drives multiple inputs. Buffer amplifiers could be used in other locations in the circuits described herein, but are omitted for simplicity. One of skill in the art will appreciate, though, that they might be used.

Each of the rows includes a delay element $230_1 \ldots 230_M$. (sometimes also called a "fine vernier") All the delay elements in fine vernier line are stabilized by the control from delay locked loop 210 as described above for elements in Delay Locked Loop 210, as described above. The delay elements are set to have nominal values that differ from each other by a fraction of the time delay, D, of one delay stage 212 in delay locked loop 210. In the illustrated embodiment, the fraction is 1/M of the delay D, where M is the number of delay elements 230.

Preferably, M will be some multiple of 2 and in the preferred embodiment, it is 16. Thus, the delays of each delay $230_1 \ldots 230_M$ have a delay of $0/16 D$, $1/16 D$, $2/16 D$, $\ldots$ $15/16 D$.

Figure 3:
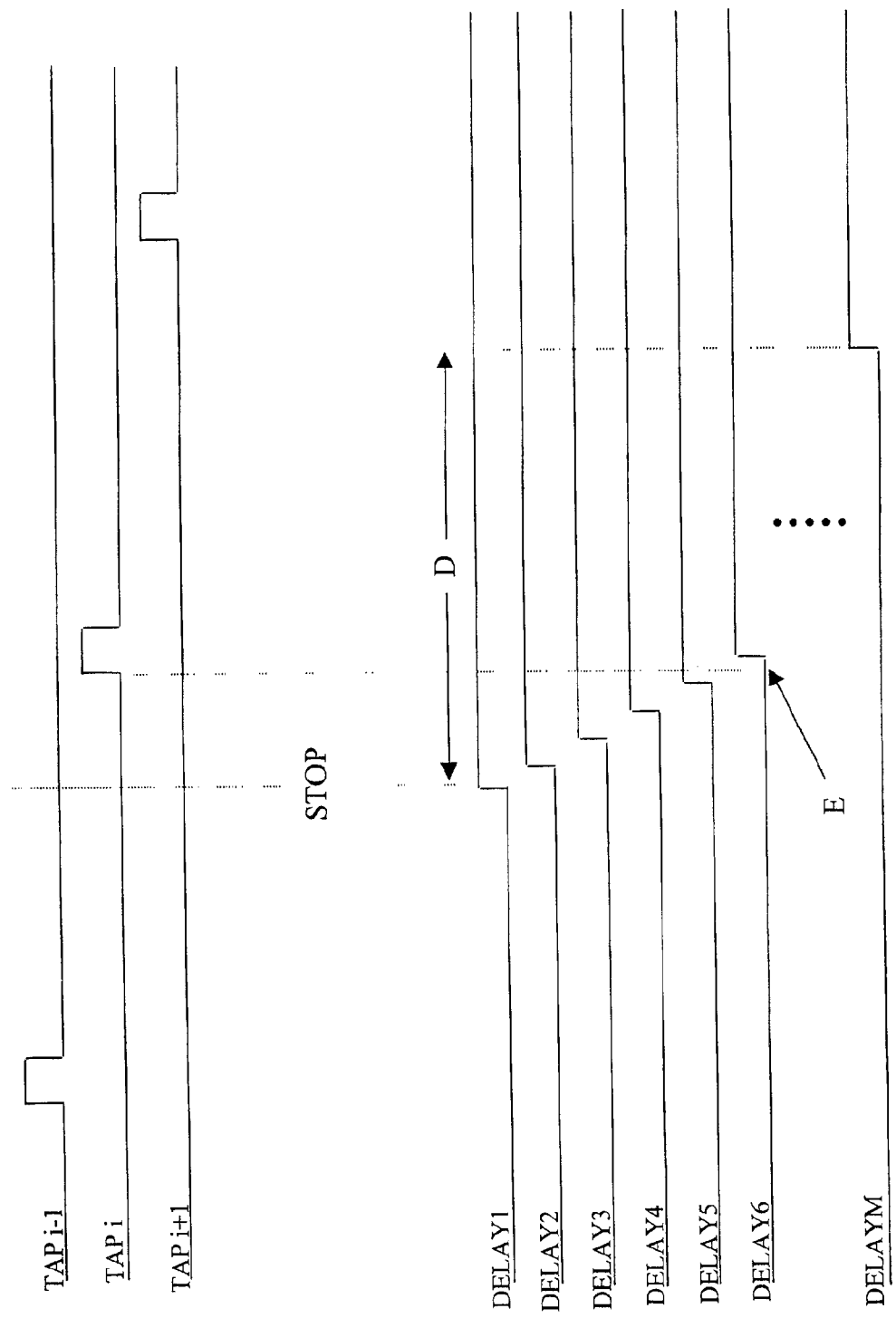
FIG. 3 is a timing diagram useful in understanding operation of the circuit of FIG. 1.

The operation of time to digital converter might be better understood by reference to FIG. 3. FIG. 3 shows the outputs of three of the delay stages 212. The outputs of delay stages in a delay locked loop are sometimes referred to as TAPs. Thus, TAPi-1, TAPi and TAPi+1 represent the outputs of three consecutive delay stages $212_{i-1}$, $212_i$, $212_{i+1}$. The signal on each of the taps has the same shape, just shifted in time by D, the delay of one delay stage.

FIG. 3 also shows the outputs of the delays $230_1 \ldots 230_M$. At some time, the STOP signal will be asserted. As long as the ARM signal is active, one shot 218 will produce an output signal that is de-asserted before the STOP signal and asserted after it. This signal is fanned out to each of the delays $230_1 \ldots 230_M$. Delay $230_1$ adds 0 delay, and so reflects the signal out of one shot 218. Delay $230_2$ adds a delay that is a fraction of D and so DELAY 2 reflects a signal with the same shape as DELAY1, just slightly delayed. Each of the delays in turn produces an identical signal, delayed slightly more. DELAYM is delayed by an amount D relative to the DELAY 1.

As described above, counter 112 (FIG. 1) measures time in counts of a clock signal. Time to digital converter measures time as a fraction of the period of that clock. That fraction can be thought of as again having two pieces. The pieces are selected by the coincidence of signals from a particular tap of delay locked loop 210 and a particular delay element $230_1 \ldots 230_M$. As shown in FIG. 3 the signals DELAY1 ... DELAY M span a window of duration D that includes the pulse at the output of TAPi. Thus, TAPi is selected to generate the upper bits of the fractional time measurement.

The edge giving rise to the TAPi signal is delayed by i delay stages since a clock pulse was input to the delay chain 212. Thus, selecting a tap closest to the occurrence of the STOP signal allows a measurement of the fraction of a clock period that must be added to the time measured by counter 112. That time is i*D. Because i is an integer, this measurement has a resolution of D. In an example case, where the input clock is 400 MHz and N=16, D=2.5 nsec/16=156 psec.

The fractional time measurement can be made with even greater resolution by using the outputs of delay elements $230_1 \ldots 230_M$. The specific delay signal that is asserted immediately after the TAPi signal is identified at E in FIG. 3 and is, in the illustrated example, the output of DELAY6. The STOP signal that gave rise to the output of DELAY6 therefore must have occurred before the edge E by an amount of time equal to the delay of DELAY6. This information can be used to adjust the fractional time measurement derived from selecting a TAPi. It is desirable to have a maximum delay difference R between the minimum delay element $230_1$ and the maximum delay element $230_M$ which is greater than or equal to the delay a single delay line stage. This insures there will be no "holes" in the field of sampled times which increase the potential error in the time measurement. In our example, if D=156 psec, then R must be greater than or equal to D.

In particular, by correlating the outputs of the delay locked loop 210 and the delays $230_1 \ldots 230_M$, an accurate time measurement can be made. In particular, the fractional time could be computed from the equation $$i*D - j*R/M, \text{ where R is greater than or equal to D} \quad \text{EQ(1)}$$

where j is the number of the delay $230_1 \ldots 230_M$ that correlates with an output of one of the delay elements. The number resulting from this equation represents a time after a pulse of CLK2, which is clocking counter 112. Thus, if counter 112 stops counting when the STOP signal is received, value in the counter times the period of CLK2 indicates a course time measurement. Adding the quantity computed in Equation 1 to this course measurement gives a more accurate measurement of the elapsed time.

It should be appreciated that there could be various delays in the circuits that process the time measurement signals. In some cases, these delays must be compensated for in the computation. In other cases, the effect of the delays can be eliminated by inserting compensating delays into the circuit. In other words, a delay in one signal relative to other signals can be compensated for by inserting an equal delay into all the other signals.

Thus, the actual circuit used in the time measurement system might have delays that are not expressly shown. Or, delays might be eliminated by adding or subtracting appropriate delays in the computations leading to a final time measurement.

Alternatively, it should be appreciated that fixed delays in the circuits can be compensated for using calibration RAM 120 or encoder 118. A time measurement that has been impacted by a delay within the circuitry can be mapped to a time value without the delay.

The column circuits $214_1 \ldots 214_N$ determine the coincidence of the signals from delays $230_1 \ldots 230_M$ and the signals from the taps of delay line 210. As will be described in greater detail in conjunction with FIG. 4, each column circuit receives a signal from one of the taps of delay line 210 and all of the signals from delays $230_1 \ldots 230_M$. The column circuit outputs a code indicating coincidence of these signals.

Figure 4:
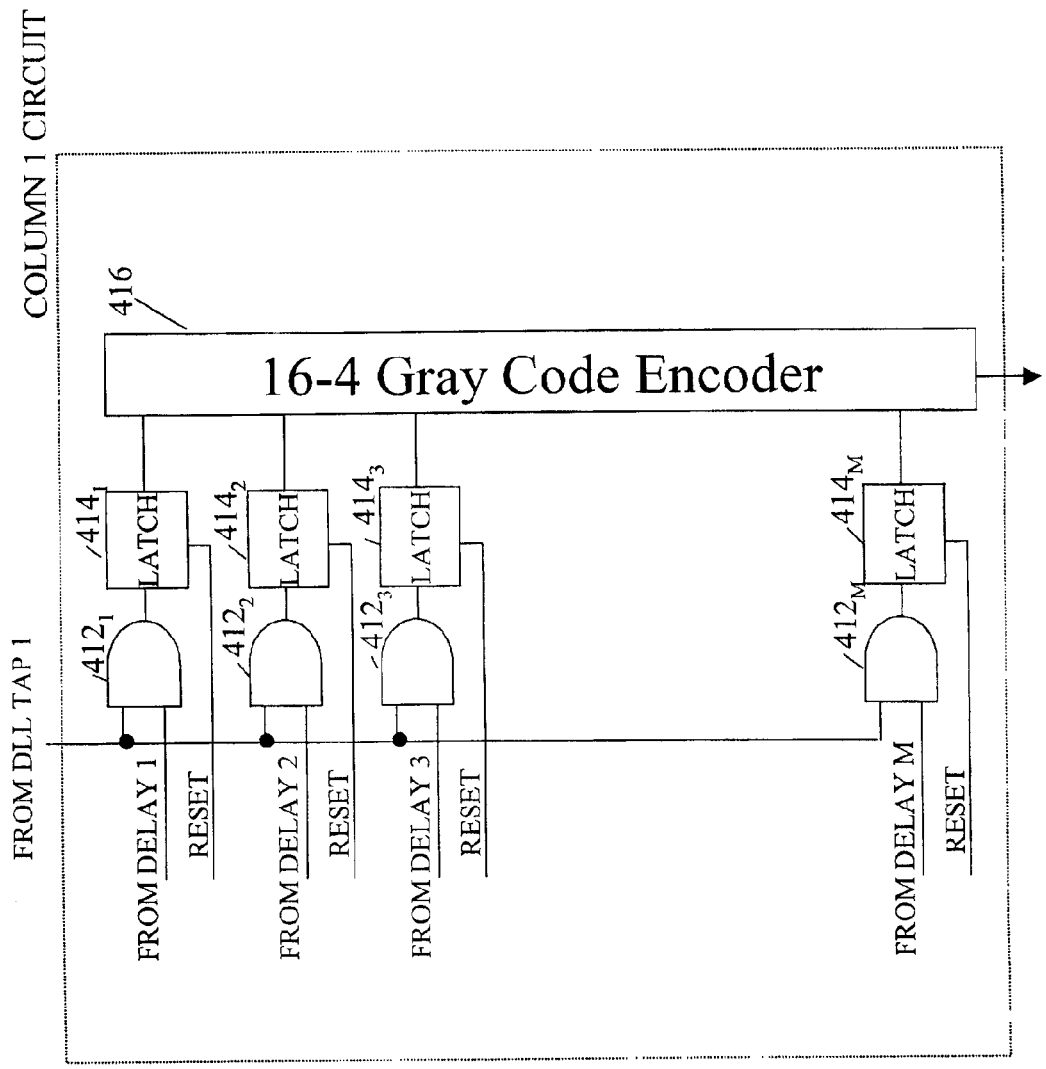
FIG. 4 shows in greater detail a column circuit of FIG. 2.

Referring to FIG. 4, the details of a column circuit are shown. Column1 Circuit is shown for illustration, but preferably all the column circuits will be similar. It is connected to the first tap of DLL210. The tap signal is routed to a plurality of AND gates $412_1 \ldots 412_M$. A buffer amplifier or other fan out circuit might be required, but is not shown for simplicity, as such circuits are well known in the art.

The second input to each of the AND gates $412_1 \ldots 412_M$ comes from one of the delay circuits $230_1 \ldots 230_M$. Thus, each of the AND gates $412_1 \ldots 412_M$ has an output that is asserted when there is coincidence between a tap of DLL 210 and an output of one of the delay circuits $230_1 \ldots 230_M$.

If there is coincidence as reflected by the output of one of the AND gates $412_1 \ldots 412_M$, then the corresponding RS latch circuit $414_1 \ldots 414_M$ latches to capture that event.

As noted in FIG. 3, multiple ones of the outputs of the delay circuits $230_1 \ldots 230_M$ might coincide with the output of a particular tap signal. For example, $TAP_{i+1}$ overlaps with all of outputs of the delay circuits $230_1 \ldots 230_M$ because the STOP signal occurred before $TAP_{i+1}$. In contrast, $TAP_{i-1}$ overlaps with none of the outputs of delay circuits $230_1 \ldots 230_M$ because the STOP signal occurred after $TAP_{i-1}$. The $TAP_i$ signal overlaps with only a portion of the outputs of delay circuits $230_1 \ldots 230_M$, indicating that the STOP signal occurred less than a time D before the $TAP_i$ signal.

The amount of time that the STOP signal occurred before the $TAP_i$ signal can be determined by identifying the delay circuit $230_1 \ldots 230_M$ with the longest delay that produces an output overlapping the $TAP_i$ signal. In FIG. 3, DELAY6 is the longest delay that still overlaps with the $TAP_i$ output.

Thus, to make a time measurement, data indicating which of the delay signals overlaps each of the TAP signals must be captured. Each column circuit produces this data for one TAP signal and it is reflected in the outputs of the one-shot circuits $414_1 \ldots 414_M$. These outputs can be encoded to reduce the number of data lines needed to reflect the data. Gray-code encoder 416 compresses the data from M bits to some smaller number of bits without loss of information. A gray code encoder is chosen for the preferred embodiment, but other forms of encoding could be used, or the encoding might be omitted entirely.

The outputs of all of the column circuits contain the required data needed for a time measurement. The pattern of bits generated by all of the column circuits taken together indicates which TAP and which DELAY coincides with the STOP signal. In the preferred embodiment, circuitry within time stamp circuitry converts the pattern of bits at the output of each column circuit to a value representing a time measurement.

In the illustrated embodiment, the circuitry that converts the pattern of bits into a value representing a time measurement is encoder 118 (FIG. 1). Referring to Eq(1), for every value of i and j, there is a unique pattern of bits. Encoder 118 maps the pattern of bits for each value of i and j to a number reflecting the results of Eq(1) for that value of i and j.

Figure 5:
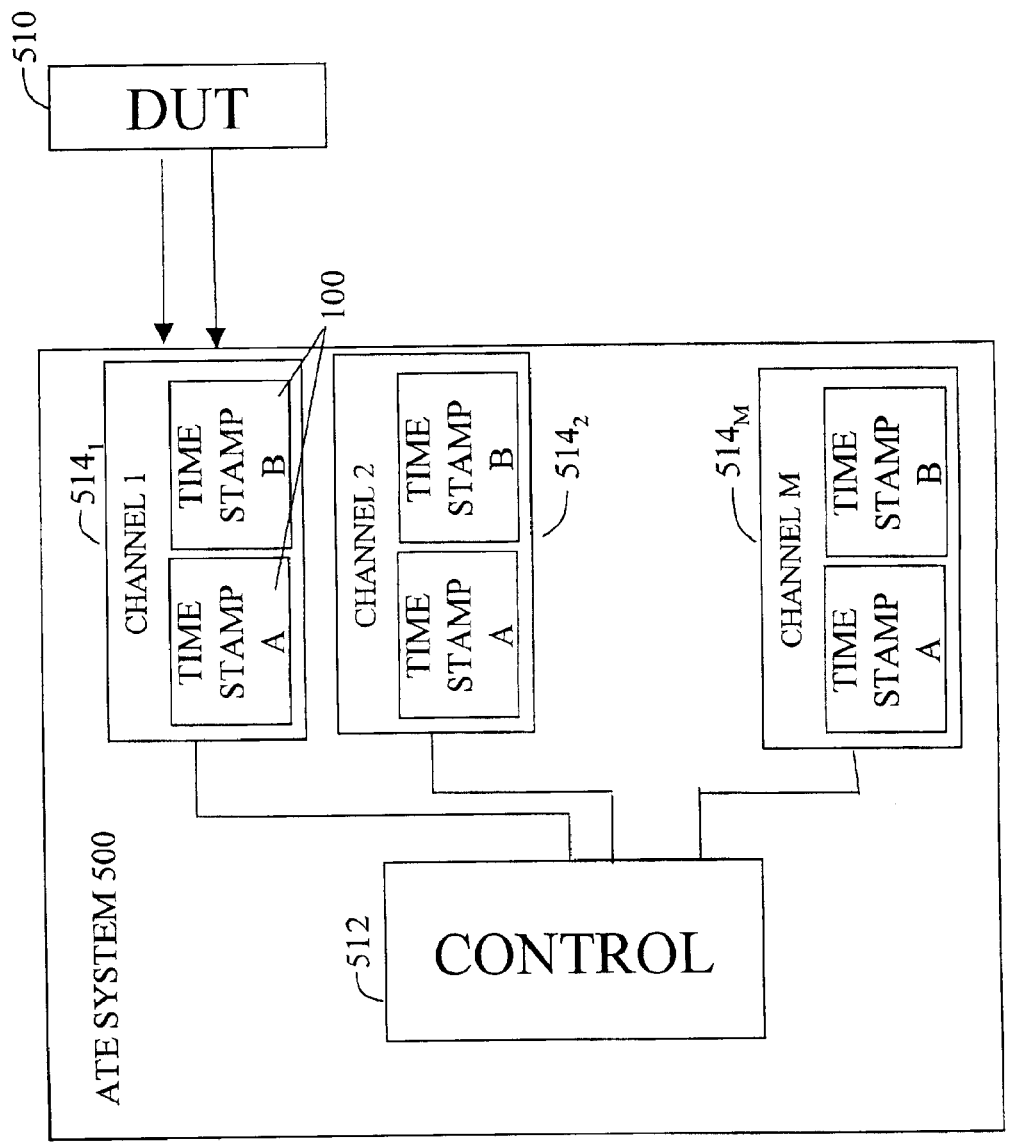
FIG. 5 is a block diagram of an automatic test system incorporating time measurement circuits as shown in FIG. 1.

As described above, encoder 118 maps the pattern of bits to a time measurement assuming all delay elements within the time measurement circuit operate at the nominal values. As described above, these measurement values can then be adjusted to calibrate out any deviations from the nominal values. In this way, the low order bits of the OUTPUT of the time measurement circuit is generated The time measurement output can be used in many ways. The circuit is particularly useful in automatic test equipment. FIG. 5 shows an automatic test system 500. Automatic test system (ATE) 500 is of the type used to test semiconductor devices during their manufacture. An example of such a test system is the J750 sold by Teradyne, Inc.

In use, one or more semiconductor devices, indicated as DUT 510, are connected to ATE 500. ATE 500 generates and measures test signals for DUT 510. By comparing the measured signals to expected values, ATE 500 can determine whether DUT 510 is properly functioning.

One type of measurement that might be made on DUT 510 is a time measurement. For example, a measurement might be made to determine whether DUT 510 produces an output signal an appropriate amount of time after a certain input is applied. If the input is synchronized to the CLOCK signal that drives time measurement circuit 100, the input can be used as the START signal shown in FIG. 1. The output of DUT 510 can then be used as the STOP signal and time measurement circuit will indicate the elapsed time between the input and output signals.

If the signal representing the beginning of the interval to be measured is not synchronized with the CLOCK signals, time measurements might still be made. Two time stamp circuits 100 could be used to make the measurement. FIG. 5 shows an A and a B time stamp circuit per channel. To make a time measurement, both time stamp circuits A and B would be given the same START signal. In this case, the START signal would act as a common time reference for each time stamp circuit A and B.

Time stamp circuit A would receive as its STOP signal the signal from DUT 510 indicating the start of the time interval to be measured. Time stamp circuit B would receive as its STOP signal the signal from DUT 510 indicating the end of the time interval to be measured. To determine the elapsed time between the two signals, the output of time stamp A could be subtracted from the output of time stamp B.

While a time measurement circuit as described above could be implemented in many different ways, the above-described design could be implemented as a CMOS integrated circuit chip. CMOS circuits are cheap and consume relatively little power. However, CMOS has not traditionally been used in time measurement circuits because the delay through CMOS circuit elements can vary widely based on fabrication conditions and operating temperature. Thus, it is difficult to make accurate measurement circuits using CMOS.

As described above, DLL 210 generates a control signal that is used to compensate for many types of delays. Calibration circuits are also used to compensate for delays. As a result, the described circuit is accurate enough for use in ATE systems. And, the circuit has the advantage of being small enough that it could be implemented as part of the same integrated circuit chip that holds circuitry to generate or measure test signals of one channel of the test system. In some test systems, signals for multiple channels are generated on a single chip. In that case, there might be two time stamp circuits per chip. Of course, the number of time stamp circuits per channels would depend on the intended use of the ATE.

In comparison to a traditional approach of using a long delay line to increase the accuracy of the measurement, the above circuit has a fast refire time. In the traditional approach, two delay lines are provided, one of which delays the clock and the other delaying the edge being measured. The delay elements on the clock path have delay T1 and the delay elements on the edge input have delay T2. At each delay stage, the clock path outputs are tied to the clock input of a latch and the edge path outputs are tied to the D input of the latch. Then each stage in the delay path can be used to measure a time difference of T2-T1 compared to the previous stage. This is easily implementable in CMOS. However, the delay through the full delay line is T1*Tclk/(T2-T1), or for example 16 times the clock period Tclk if T2-T1 is 1/16 of T1. This means the refire time (time before the timestamp can be reused) is long, at least 16 clock cycles, and the signal accumulates errors due to jitter and power supply noise during this entire time period. The design described in this document avoids these issues because of the use of the two dimensional array of time sampling elements. As a result, the maximum delay through the circuit is less than 2 clock periods and the refire time is therefore much better and the jitter and noise issues consequently less.

Having described one embodiment, numerous alternative embodiments or variations might be made. For example, it is not necessary that each delay element have a value that exactly matches the nominal value or that the nominal values of the delay be equally spaced. Calibration memory 120 can compensate for any deviations that are fixed.

Also, it should be appreciated that the operation of the time to digital converter was explained in which the output of one of the delay elements $230_1 \ldots 230_M$ is subtracted from a time measured by a selected signal from the output of a tap of delay line 210. A functioning circuit could alternatively be constructed by additional delay into the tap outputs, such that the As another example, it should be noted that delay locked loop 210 includes a stage $212_{N+1}$ that is not connected to anything. This stage is present to ensure that each tap of the delay line sees the same load. Keeping all loads the same ensures that each stage has the same delay. Additional stages might be added to the input of the delay line, either to insert a fixed delay or to also equalize the input loads of each delay stage.

Further, it should be appreciated that some parts of the circuit were described as being implemented with level sensitive components. It is possible that the circuits could be implemented with edge sensitive components. The circuit would still function according to the concepts defined herein. However, the precise details of timing of specific signals would differ.

Also, it should be appreciated, as shown in FIG. 3, that, though DELAY6 is the signal that is selected as being coincident with TAPi, the signals DELAY1 through DELAY5 are asserted at the same time that TAPi is asserted. However, these signals are not taken to be "coincident". The goal is to identify the particular one of the DELAY signals that changes state near the change in state of the TAPi signal. Edge sensitive circuits might be used for this purpose. Or software or circuitry that examines the outputs of AND gates $412_1 \ldots 412_M$ in order to detect a transition from a HI to LO output could be used to determine coincidence.

As another example of a possible variation, some of the functions described above could be implemented in software. For example, it was described that encoder 118 converted output bits of each column circuits into a number reflecting the time of the STOP signal. The same function could alternatively have been performed in software. Likewise, a hardware based calibration was described, but corrections to better calibrate time measurements could also have been applied in software.

As another example, it is described that a delay locked loop is used to generate the TAP signals. However, a phase locked loop might also be employed.

As a further example, FIG. 3 indicates that the time of event E is determined by declaring that DELAY6 is coincident with the TAPi signal. DELAY6 occurs first after the TAPi signal. However, as indicated in FIG. 3, it is possible that the edge of the TAP signal will fall between two adjacent of the edges of the DELAY signals. In the example, TAPi actually occurs between the DELAY 5 and the DELAY 6 signals. Coincidence might alternatively be determined by selecting the DELAY signal that occurs most recently before the TAPi signal.

Further, it should be appreciated that the various processing circuits may have various amounts of delay associated with them. Thus, coincidence does not necessarily mean that the signals occur simultaneously. For example, one or the other of the signals might be offset in time in make up for delay in other circuit elements.

Therefore, the invention should be limited only by the spirit and scope of the appended claims.

What is claimed is:

1. A time measurement circuit comprising:
   a) a clock input;
   b) a delay chain having an input connected to the clock input, the delay chain having a plurality of delay elements each having an output and a tap at the output of each delay element;
   c) a STOP input;
   d) a second plurality of delay elements, each having an input and an output and each providing a delay between the input and output, wherein the input of each of the second plurality of delay elements is coupled to the STOP input; and
   e) a coincidence circuit having a first plurality of inputs, each coupled to one of the taps and a second plurality of inputs, each coupled to the output of one the second plurality of delay elements, and an output, the output representing the coincidence between one of the taps and one of the outputs of the second plurality of delay elements.

2. The time measurement circuit of claim 1 wherein the coincidence circuit comprises a plurality of column circuits, each having an input connected to one of the taps and a second set of inputs, each connected to one of the outputs of the second plurality of delay elements.

3. The time measurement circuit of claim 2 wherein each of the column circuit comprises a plurality of logic circuits, each having a first input connected to said tap and a second input, connected one of the outputs of the second plurality of delay elements, and an output reflecting coincidence of the inputs.

4. The time measurement circuit of claim 3 wherein each of the column circuits additionally comprises an encoder circuit, the encoder circuit having a plurality of inputs, each connected to the output of a logic circuit and an output, reflecting coincidence of each of the inputs.

5. The time measurement circuit of claim 2 wherein each of the coincidence circuits comprises an encoder and the output of each column circuit has fewer bits than the number of inputs in the second set of inputs.

6. The time measurement circuit of claim 1 wherein the coincidence circuit comprises circuitry producing a first plurality of sets of intermediate signals, each set of intermediate signals representing the coincidence between one of the first plurality of inputs and each of the second plurality of inputs.

7. The time measurement circuit of claim 6 wherein the coincidence circuit additionally comprises an encoder circuit having inputs connected to the sets of intermediate signals and an output reflecting the nominal measured time value.

8. The time measurement circuit of claim 7 additionally comprising a calibration memory, having an input reflecting the nominal time measurement coupled to the encoder circuit and an output reflecting the calibrated time.

9. The time measurement circuit of claim 1 additionally comprising a counter having a count input coupled to said counter and an input for disabling counting coupled to the STOP input.

10. The time measurement circuit of claim 1 wherein each of the elements in the delay chain has a nominal delay of D and the difference between the longest delay and the shortest delay introduced by the second plurality of delay elements exceeds D.

11. The time measurement circuit of claim 1 wherein the delay chain is part of a delay locked loop.

12. A time measurement circuit, comprising:
   a) a clock input;
   b) a first circuit having an input coupled to the clock and a first plurality of outputs, each representing the clock delayed by a different amount;
   c) a STOP input;
   d) a second circuit having an input coupled to the STOP input and a second plurality of outputs, each representing the STOP input delayed by a different amount;
   e) a third circuit accepting as inputs the outputs of the first circuit and the second circuit, the third circuit having a digital output containing a plurality of bits that represent coincidence between one of the first plurality of signals and one of the second plurality of signals.

13. The time measurement circuit of claim 12 wherein the first circuit comprises a delay locked loop.

14. The measurement circuit of claim 12 wherein the third circuit comprises a plurality of encoders, each encoding the pattern of bits formed by computing the logical AND between one of the first plurality of outputs and each of the second plurality of outputs.

15. The time measurement circuit of claim 12 wherein the third circuit additionally comprises a calibration memory.

16. The time measurement circuit of claim 12 wherein the time measurement circuit is implemented as a CMOS integrated circuit chip.

17. The time measurement circuit of claim 16, wherein the CMOS integrated circuit is adapted for use in automatic test equipment having a plurality of channel circuits and the integrated circuit chip additionally comprises at least one of the channel circuits.

18. The time measurement circuit of claim 12 used within automatic test equipment, wherein:
   a) the test equipment additionally comprises a second time measurement circuit as in claim 12;
   b) the time measurement circuit and the second time measurement circuit are connected to a common clock; and
   c) the STOP input of the time measurement circuit is connected to a signal that indicates that start of an interval to be measured and the STOP input of the second time measurement circuit is connected to signal that indicates the end of an interval to be measured; and d) the test equipment additionally comprises a controller, connected to the time measurement circuit and the second time measurement circuit that outputs a time value reflecting the difference in time measured by the second time measurement circuit and the first time measurement circuit.

19. The time measurement circuit of claim 18 wherein the time measurement circuit and the second time measurement circuits each includes a counter connected to the common clock signal.

20. The time measurement circuit of claim 19 wherein the time measurement circuit and the second time measurement circuit and said counters are implemented on a CMOS chip.

* * * * *